(12) United States Patent
Chang et al.

(10) Patent No.: US 11,177,379 B2
(45) Date of Patent: Nov. 16, 2021

(54) GATE-SINKING PHEMTS HAVING EXTREMELY UNIFORM PINCH-OFF/THRESHOLD VOLTAGE

(71) Applicant: WIN Semiconductors Corp., Tao Yuan (TW)

(72) Inventors: Chia-Ming Chang, Tao Yuan (TW); Jung-Tao Chung, Tao Yuan (TW); Chang-Hwang Hua, Tao Yuan (TW); Ju-Hsien Lin, Tao Yuan (TW); Yan-Cheng Lin, Tao Yuan (TW); Yu-Chi Wang, Tao Yuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 0 days.

(21) Appl. No.: 16/446,207

(22) Filed: Jun. 19, 2019

(65) Prior Publication Data

US 2020/0403091 A1  Dec. 24, 2020

(51) Int. Cl.
*H01L 29/778* (2006.01)
*H01L 29/205* (2006.01)
*H01L 29/47* (2006.01)
*H01L 29/66* (2006.01)

(52) U.S. Cl.
CPC ........ *H01L 29/7787* (2013.01); *H01L 29/205* (2013.01); *H01L 29/475* (2013.01); *H01L 29/66462* (2013.01)

(58) Field of Classification Search
CPC . H01L 29/7787; H01L 29/205; H01L 29/475; H01L 29/66462; H01L 29/7785; H01L 21/8252; H01L 27/0605; H01L 29/0843; H01L 29/7783; H01L 33/145; H01L 27/0883; H01L 21/823456; H01L 21/28587; H01L 29/802; H01L 29/207;
(Continued)

(56) References Cited

U.S. PATENT DOCUMENTS

2004/0104404 A1* 6/2004 Bito .................... H01L 29/0843
257/192
2006/0027840 A1* 2/2006 Wohlmuth ........ H01L 21/82345
257/267

(Continued)

*Primary Examiner* — Mouloucoulaye Inoussa
(74) *Attorney, Agent, or Firm* — Muncy, Geissler, Olds & Lowe, P.C.

(57) ABSTRACT

A gate-sinking pseudomorphic high electron mobility transistor comprises a compound semiconductor substrate overlaid with an epitaxial structure which includes sequentially a buffer layer, a channel layer, a Schottky layer, and a first cap layer. The Schottky layer comprises from bottom to top at least two stacked regions of semiconductor material. Each of the two adjacent stacked regions differs in material from the other and provides a stacked region contact interface therebetween. In any two adjacent stacked regions of the Schottky layer, one stacked region composed of AlGaAs-based semiconductor material alternates with the other stacked region composed of InGaP-based semiconductor material. A gate-sinking region is beneath the first gate metal layer of the gate electrode, and the bottom boundary of the gate-sinking region is located at the one of the at least one stacked region contact interface of the Schottky layer.

18 Claims, 7 Drawing Sheets

(58) Field of Classification Search
CPC ............ H01L 29/1066; H01L 29/7784; H01L 29/517
USPC ..... 257/194, 192, 195, 76, 451, 97, 86, 902, 257/183, 199, 471, 267, E29.25; 438/167, 172
See application file for complete search history.

(56) References Cited

U.S. PATENT DOCUMENTS

| | | | |
|---|---|---|---|
| 2008/0237638 A1* | 10/2008 | Bito | H01L 29/432 257/192 |
| 2012/0126288 A1* | 5/2012 | Bito | H01L 27/0605 257/192 |
| 2013/0062667 A1* | 3/2013 | Chini | H01L 21/8252 257/195 |

* cited by examiner

GATE-SINKING PHEMTS HAVING EXTREMELY UNIFORM PINCH-OFF/THRESHOLD VOLTAGE

FIELD OF THE INVENTION

The present invention relates to pseudomorphic high electron mobility transistors (pHEMTs) and more particularly to gate-sinking pHEMTs having inherently extremely uniform pinch-off or threshold voltage across a wafer and from wafer to wafer.

BACKGROUND OF THE INVENTION

Gate-sinking or buried-gate technique has been widely adopted to achieve enhancement-mode (E-mode) pseudomorphic high electron mobility transistors (pHEMTs) in which the pinch-off or threshold voltages (pinch-off voltage hereafter) exhibit positive values due to the reduction of the gate-to-channel distance. As the transistor epitaxial structure and fabrication process are properly designed, the application of the gate-sinking technique should include but not be limited to E-mode pHEMTs. The gate-sinking technique requires careful control of the temperature and duration during the thermal treatment to ensure that the first deposited gate metal diffuses uniformly, consistently, and fully into the Schottky barrier layer. Accordingly, gate-sinking pHEMTs with highly uniform pinch-off voltage across a wafer and from wafer to wafer are mostly demanded in this field.

Figure 1:
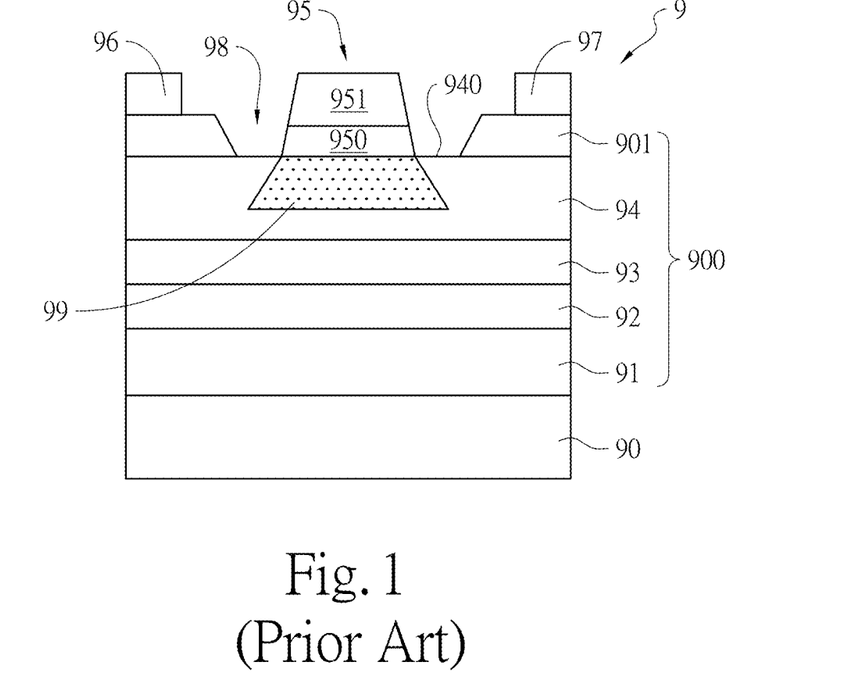
FIG. 1 is a simplified cross-sectional side view of a conventional embodiment of a gate-sinking pHEMT.

FIG. 1 illustrates a simplified cross-sectional structure of a conventional gate-sinking pHEMT. The conventional gate-sinking pHEMT 9 comprises a compound semiconductor substrate 90, an epitaxial structure 900, a source electrode 96, a drain electrode 97, and a gate electrode 95. The epitaxial structure 900 grown over the compound semiconductor substrate 90 comprises a buffer layer 91, a channel layer 92, a carrier supply layer 93, a Schottky barrier layer 94, and a first cap layer 901. The buffer layer 91 is formed on the compound semiconductor substrate 90. The channel layer 92 is formed on the buffer layer 91. The carrier supply layer 93 is formed on the channel layer 92. The Schottky barrier layer 94 is formed on the carrier supply layer 93. The first cap layer 901 is formed on the Schottky barrier layer 94. The source electrode 96 is formed on one end of the first cap layer 901. The drain electrode 97 is formed on the other end of the first cap layer 901. A gate recess 98 is located between the source electrode 96 and the drain electrode 97, wherein a recess bottom 940 of the gate recess 98 is defined by the Schottky barrier layer 94. The gate electrode 95 comprises a first gate metal layer 950 overlaid with at least one second gate metal layer 951. The gate electrode 95 is formed on the Schottky barrier layer 94 within the gate recess 98, wherein the first gate metal layer 950 of the gate electrode 95 is formed on the Schottky barrier layer 94. Under proper thermal treatment, a gate-sinking region 99 is observed beneath the first gate metal layer 950 of the gate electrode 95 within the Schottky barrier layer 94. The distance between the channel layer 92 and the bottom boundary of the gate-sinking region 99 unambiguously determines the pinch-off voltage of a pHEMT.

Figure 2A:
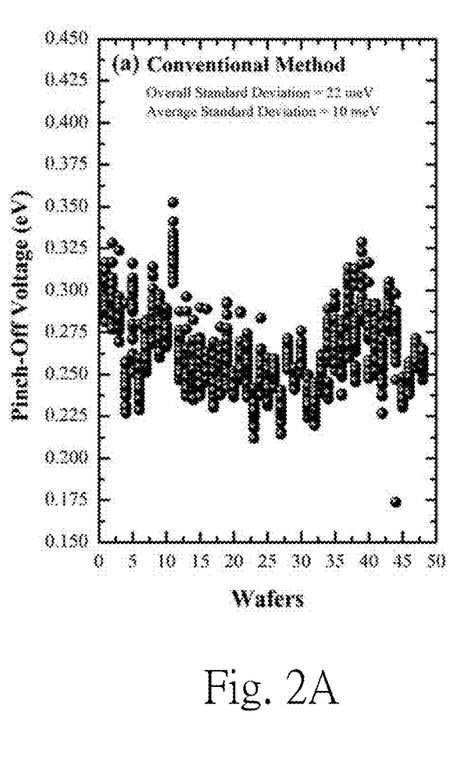
FIGS. 2A and 2B are distributions of pinch-off voltage across wafers for gate-sinking pHEMTs using conventional method and present invention, respectively.
Figure 2B:
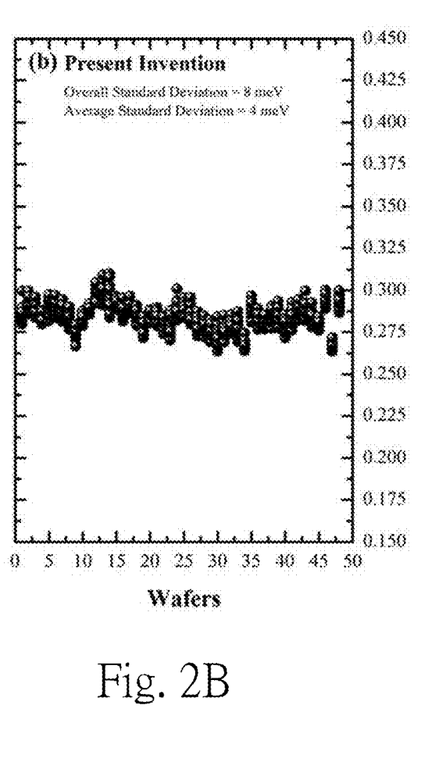

The conventional gate-sinking pHEMT 9 shown in FIG. 1 has several problematic aspects. In such a structure, it is very difficult to control the bottom boundary of the gate-sinking region 99 perfectly at a specific narrow region within the Schottky barrier layer 94. This fact can be ascribed to the variations in the first gate metal layer 950 thickness, thermal treatment temperature, and thermal treatment duration across a wafer and from wafer to wafer. These undesirable effects cause a high degree of variability in transistor pinch-off voltage across a wafer. As a result, a high standard deviation is observed. FIG. 2A shows a distribution of pinch-off voltages of the conventional gate-sinking pHEMTs across 48 different wafers (25 transistors per wafer). As can be seen in FIG. 2A, the overall standard deviation (calculated from 1,200 data) and average standard deviation (calculate standard deviation per wafer and take their average) of the conventional gate-sinking pHEMTs are over two times higher than those of the gate-sinking pHEMTs of the present invention shown in FIG. 2B.

Accordingly, a new design to avoid the aforementioned drawbacks is desirable. Most importantly, the present invention is not limited to E-mode pHEMTs, and it can be extended into normally-on depletion-mode (D-mode) pHEMTs.

SUMMARY OF THE INVENTION

In order to achieve the expected pinch-off voltage uniformity in both E-mode and D-mode pHEMTs, the present invention provides techniques to realize gate-sinking pHEMTs with extremely inherently uniform pinch-off voltage across a wafer. Such a highly uniform pinch-off voltage pHEMT comprises a compound semiconductor substrate, an epitaxial structure, a source electrode, a drain electrode, and a gate electrode. The epitaxial structure is grown over the compound semiconductor substrate and sequentially comprises a buffer layer, a channel layer, a Schottky layer, and a first cap layer. The buffer layer is formed on the compound semiconductor substrate. The channel layer is formed on the buffer layer. The Schottky layer is formed on the channel layer and comprises from bottom to top at least two stacked regions of semiconductor material, wherein each of the two adjacent stacked regions differs in material from the other and provides a stacked region contact interface therebetween. The first cap layer is formed on the Schottky layer. The source electrode is formed on one end of the first cap layer. The drain electrode is formed on the other end of the first cap layer, wherein a gate recess is located between the source electrode and the drain electrode. The gate electrode comprises a first gate metal layer, wherein the first gate metal layer of the gate electrode is deposited on the Schottky layer within the gate recess. A gate-sinking region is beneath the first gate metal layer of the gate electrode, and a bottom boundary of the gate-sinking region is located within 10 Å above or below one of the at least one stacked region contact interface of the Schottky layer.

Moreover, the present invention provides another gate-sinking pHEMT, comprising a compound semiconductor substrate, an epitaxial structure, a source electrode, a drain electrode, and a gate electrode. The epitaxial structure is grown over the compound semiconductor substrate and sequentially comprises a buffer layer, a channel layer, a Schottky layer, a first contact layer, and a first cap layer. The buffer layer is formed on the compound semiconductor substrate. The channel layer is formed on the buffer layer. The Schottky layer is formed on the channel layer and comprises from bottom to top at least two stacked regions of semiconductor material, wherein each of the two adjacent stacked regions differs in material from the other and provides a stacked region contact interface therebetween. The first contact layer is formed on the Schottky layer, wherein the first contact layer is in contact with an upper surface of the topmost stacked region of the Schottky layer, and an uppermost contact interface is provided between the first contact layer and the topmost stacked region of the Schottky layer. The first cap layer is formed on the first contact layer. The source electrode is formed on one end of the first cap layer. The drain electrode is formed on the other end of the first cap layer, wherein a gate recess is located between the source electrode and the drain electrode. The gate electrode comprises a first gate metal layer, wherein the first gate metal layer of the gate electrode is deposited on the first contact layer within the gate recess. A gate-sinking region is beneath the first gate metal layer of the gate electrode, and a bottom boundary of the gate-sinking region is located within 10 Å above or below the uppermost contact interface.

In some embodiments, the bottom boundary of the gate-sinking region is located at one of the at least one stacked region contact interface of the Schottky layer.

In some embodiments, the bottom boundary of the gate-sinking region is located at the uppermost contact interface.

In some embodiments, a recess bottom of the gate recess is defined by the topmost stacked region of the Schottky layer, and wherein the first gate metal layer of the gate electrode is in contact with the topmost stacked region of the Schottky layer.

In some embodiments, in any two adjacent stacked regions of the Schottky layer, one stacked region composed of AlGaAs-based semiconductor material alternates with the other stacked region composed of InGaP-based semiconductor material, wherein the AlGaAs-based semiconductor material includes at least one of AlGaAs, AlGaAsP, and InAlGaAs, and wherein the InGaP-based semiconductor material includes at least one of InGaP, InGaPAs, and AlInGaP.

In some embodiments, a recess bottom of the gate recess is defined by the first contact layer, wherein the first gate metal layer of the gate electrode is in contact with the first contact layer.

In some embodiments, the first contact layer includes at least one of GaAs, AlGaAs, AlGaAsP, InAlGaAs, InGaP, InGaAsP, and InAlGaP, wherein the first contact layer differs in material from the topmost stacked region of the Schottky layer.

In some embodiments, the first gate metal layer includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), and rhenium (Re).

In some embodiments, the epitaxial structure further comprises an etch stop layer and a second cap layer, wherein the etch stop layer is formed on the first cap layer, wherein the second cap layer is formed on the etch stop layer, wherein the source electrode and the drain electrode is formed on the second cap layer.

In some embodiments, the etch stop layer includes at least one of InGaP, InGaAsP, InAlGaP, and AlAs.

In some embodiments, the second cap layer includes GaAs.

In some embodiments, the first cap layer includes GaAs.

In some embodiments, the channel layer includes at least one of GaAs and InGaAs.

In some embodiments, the buffer layer includes at least one of GaAs and AlGaAs.

In some embodiments, the compound semiconductor substrate includes GaAs.

In some embodiments, the epitaxial structure further comprises a carrier supply layer, wherein the carrier supply layer is formed on the channel layer, wherein the Schottky layer is formed on the carrier supply layer.

In some embodiments, the carrier supply layer includes at least one of AlGaAs, AlGaAsP, and InAlGaAs.

For further understanding the characteristics and effects of the present invention, some preferred embodiments referred to drawings are in detail described as follows.

DETAILED DESCRIPTIONS OF PREFERRED EMBODIMENTS

Figure 3A:
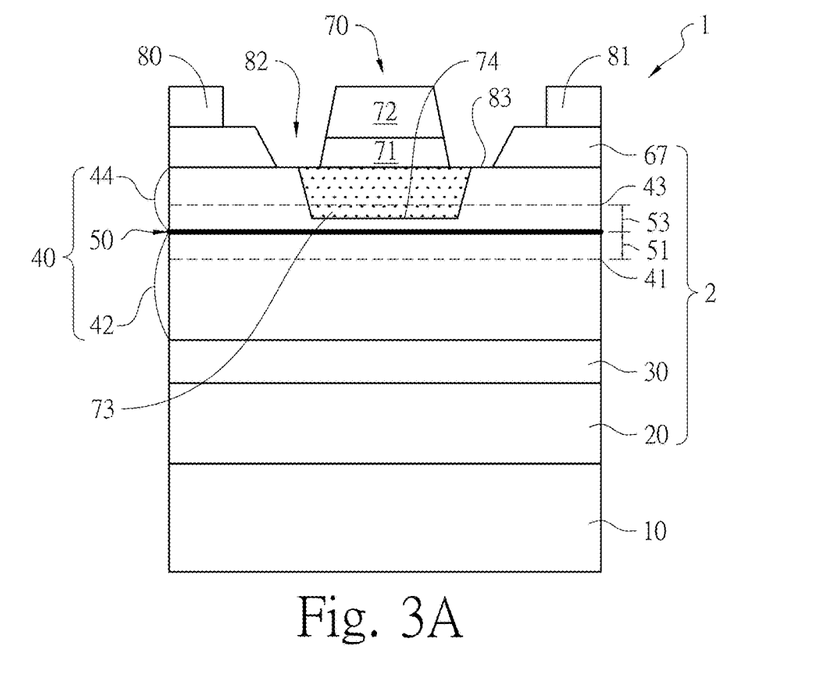
FIGS. 3A-3E are simplified cross-sectional side views of embodiments of a gate-sinking pHEMT in accordance with the present invention.
Figure 3B:
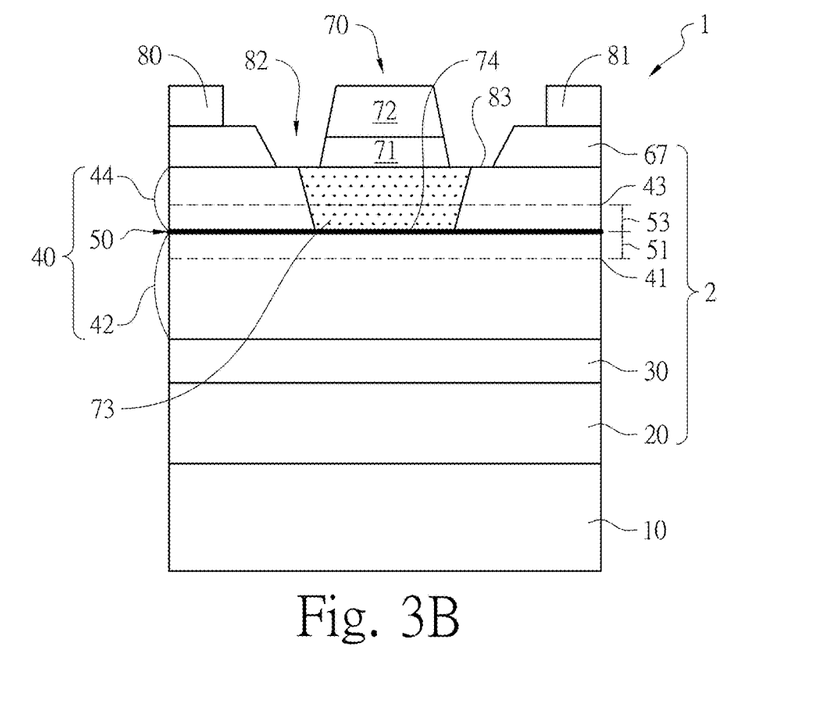
Figure 3C:
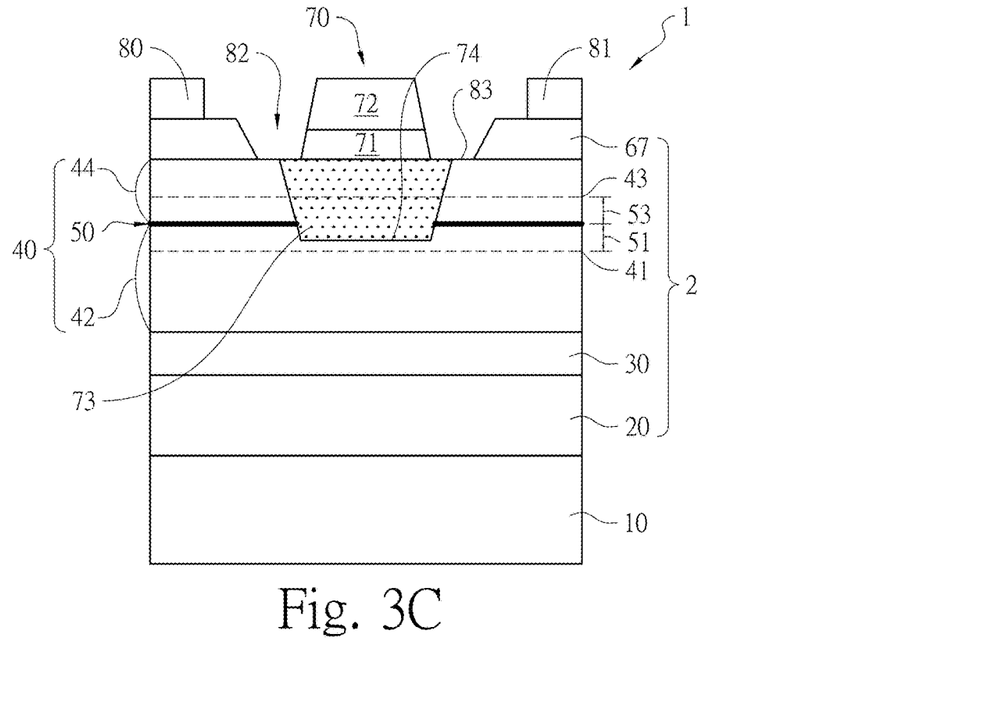

FIG. 3A is a cross-sectional side view of an embodiment of a gate-sinking pHEMT of the present invention. A gate-sinking pHEMT 1 comprises a compound semiconductor substrate 10, an epitaxial structure 2, a source electrode 80, a drain electrode 81, and a gate electrode 70. The epitaxial structure 2 is grown over the compound semiconductor substrate 10 and comprises a buffer layer 20, a channel layer 30, a Schottky layer 40, and a first cap layer 67. The buffer layer 20 is formed on the compound semiconductor substrate 10. The channel layer 30 is formed on the buffer layer 20. The Schottky layer 40 is formed on the channel layer. The Schottky layer 40 comprises from bottom to top at least two stacked regions of semiconductor material, wherein each of the two adjacent stacked regions differs in material from the other and provides a stacked region contact interface therebetween. In this embodiment, the Schottky layer 40 comprises a first stacked region 42 and a second stacked region 44. The first stacked region 42 is formed on the channel layer 30. A gate-sinking lower limit 41 is located within the first stacked region 42. The second stacked region 44 is formed on the first stacked region 42, wherein the second stacked region 44 is in contact with the first stacked region 42. A gate-sinking upper limit 43 is located within the second stacked region 44. A first stacked region contact interface 50 is provided between the first stacked region 42 and the second stacked region 44. A contact-interface-to-lower-limit distance 51 is a distance between the first stacked region contact interface 50 and the gate-sinking lower limit 41, and an upper-limit-to-contact-interface distance 53 is a distance between the gate-sinking upper limit 43 and the first stacked region contact interface 50. In a preferable embodiment, the contact-interface-to-lower-limit distance 51 is less than or equal to 10 Å. In a preferable embodiment, the upper-limit-to-contact-interface distance 53 is less than or equal to 10 Å. The first cap layer 67 is formed on the second stacked region 44 of the Schottky layer 40. The source electrode 80 is formed on one end of the first cap layer 67. The drain electrode 81 is formed on the other end of the first cap layer 67. A gate recess 82 is located between the source electrode 80 and the drain electrode 81. The gate electrode 70 comprises a first gate metal layer 71 and at least one second gate metal layer 72. The first gate metal layer 71 of the gate electrode 70 is deposited on the second stacked region 44 of the Schottky layer 40 within the gate recess 82. The at least one second gate metal layer 72 of the gate electrode 70 is deposited on the first gate metal layer 71 of the gate electrode 70. A recess bottom of the gate recess 83 is defined by the topmost stacked region of the Schottky layer 40. In this embodiment, the recess bottom 83 of the gate recess 82 is defined by the second stacked region 44, wherein the first gate metal layer 71 of the gate electrode 70 is in contact with the second stacked region 44. A gate-sinking region 73 is beneath the first gate metal layer 71 of the gate electrode 70, and a bottom boundary 74 of the gate-sinking region is located between the gate-sinking lower limit 41 and the gate-sinking upper limit 43. In this embodiment, the bottom boundary 74 of the gate-sinking region 73 is located between the gate-sinking upper limit 43 and the first stacked region contact interface 50. In some embodiments, the bottom boundary 74 of the gate-sinking region 73 is located at the first stacked region contact interface 50, as shown in FIG. 3B. In some embodiments, the bottom boundary 74 of the gate-sinking region 73 is located between the first stacked region contact interface 50 and the gate-sinking lower limit 41, as shown in FIG. 3C.

In some embodiments, the compound semiconductor substrate 10 includes GaAs. The buffer layer 20 includes at least one of GaAs and AlGaAs. The channel layer 30 includes at least one of GaAs and InGaAs. The first cap layer 67 includes GaAs. The first gate metal layer 71 of the gate electrode 70 includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), and rhenium (Re). In some embodiments, in any two adjacent stacked regions of the Schottky layer, one stacked region composed of AlGaAs-based semiconductor material alternates with the other stacked region composed of InGaP-based semiconductor material, wherein the AlGaAs-based semiconductor material includes at least one of AlGaAs, AlGaAsP, and InAlGaAs, and the InGaP-based semiconductor material includes at least one of InGaP, InGaPAs, and AlInGaP. In the present embodiment, the first stacked region 42 is composed of AlGaAs-based semiconductor material including at least one of AlGaAs, AlGaAsP, and InAlGaAs, and the second stacked region 44 is composed of InGaP-based semiconductor material including at least one of InGaP, InGaPAs, and AlInGaP. Alternatively, the first stacked region 42 may be composed of InGaP-based semiconductor material and the second stacked region 44 is composed of AlGaAs-based semiconductor material.

Figure 3D:
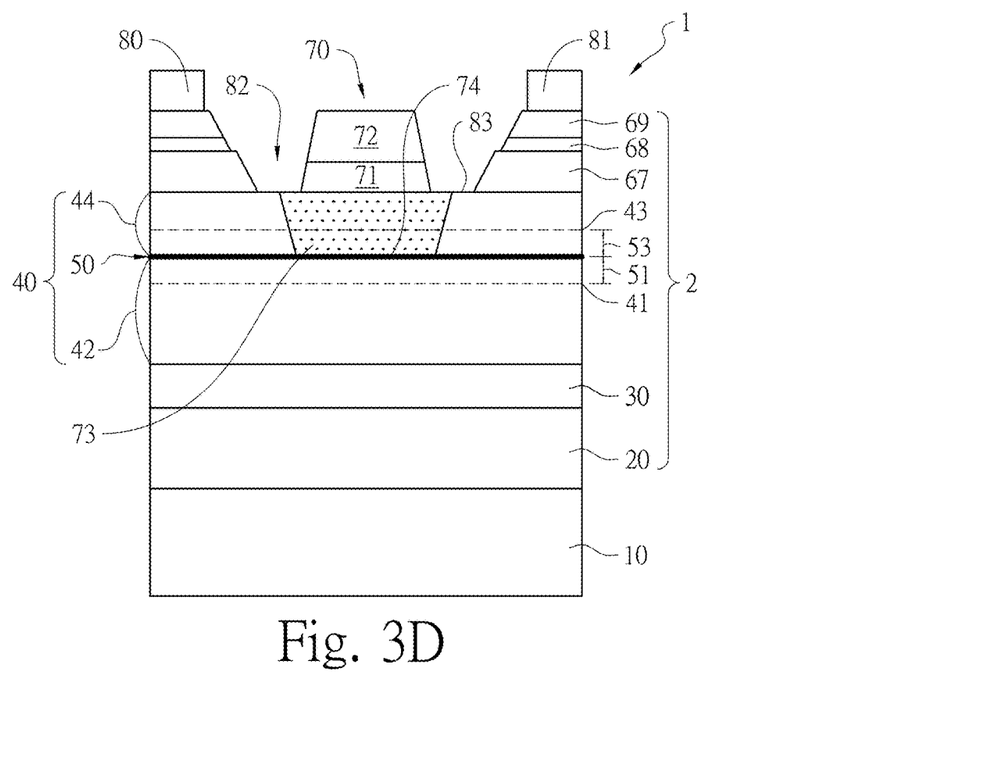

FIG. 3D is a cross-sectional side view of another embodiment of a gate-sinking pHEMT of the present invention. The main structure of the embodiment of FIG. 3D is basically the same as the structure of the embodiment shown in FIG. 3A, except that the epitaxial structure 2 further comprises an etch stop layer 68 and a second cap layer 69, wherein the etch stop layer 68 is formed on the first cap layer 67, the second cap layer 69 is formed on the etch stop layer 68, and the source electrode 80 and the drain electrode 81 are formed on the second cap layer 69. In some embodiments, the etch stop layer 68 may include at least one of InGaP, InGaAsP, InAlGaP, and AlAs. The second cap layer 69 may include GaAs.

Figures 3E, 3F:
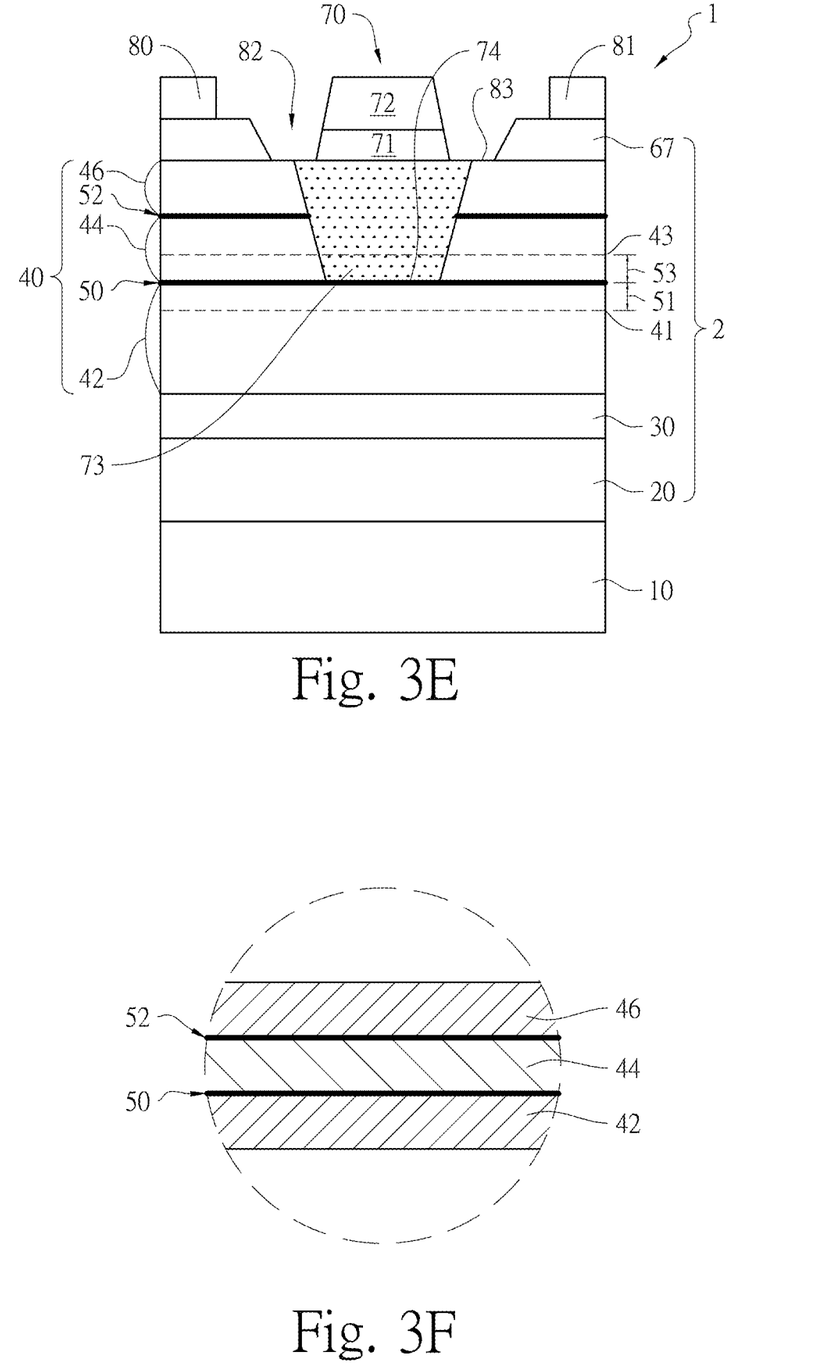
FIG. 3F is a magnified cross-sectional side view of the Schottky layer of a gate-sinking pHEMT of the present invention.

The Schottky layer 40 of the pHEMT provided by the present invention comprises two or more stacked regions of semiconductor material, wherein each of the two adjacent stacked regions differs in material from the other and provides a stacked region contact interface therebetween. FIG. 3E shows an embodiment of a gate-sinking pHEMT of the present invention, in which the Schottky layer 40 comprises three stacked regions. A partial enlargement of the Schottky layer 40 is shown in FIG. 3F. The Schottky layer 40 comprises from bottom to top a first stacked region 42, a second stacked region 44, and a third stacked region 46. A first stacked region contact interface 50 is provided between the first stacked region 42 and the second stacked region 44, and a second stacked region contact interface 52 is provided between the second stacked region 44 and the third stacked region 46. In some embodiments, the stacked regions of the Schottky layer are alternatively composed of AlGaAs-based semiconductor material and InGaP-based semiconductor material, wherein the AlGaAs-based semiconductor material includes at least one of AlGaAs, AlGaAsP, and InAlGaAs, and the InGaP-based semiconductor material includes at least one of InGaP, InGaPAs, and AlInGaP. For example, in this embodiment, the first stacked region 42 and the third stacked region 46 are composed of AlGaAs-based semiconductor material, and the second stacked region 44 is composed of InGaP-based semiconductor material. Alternatively, the first stacked region 42 and the third stacked region 46 may be composed of InGaP-based semiconductor material and the second stacked region 44 is composed of AlGaAs-based semiconductor material.

Figure 4A:
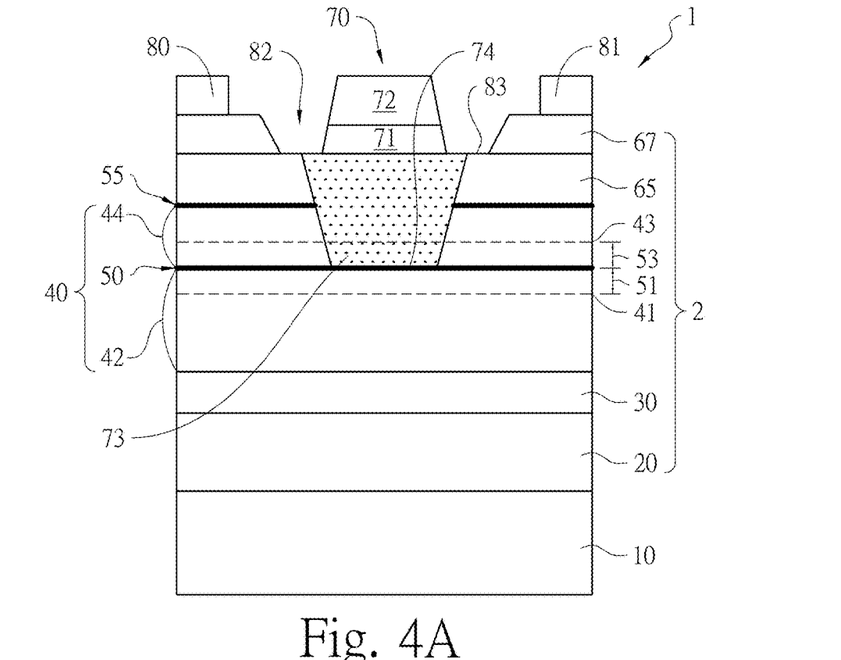
FIGS. 4A-4B are simplified cross-sectional side views of embodiments of a gate-sinking pHEMT in accordance with the present invention.

FIG. 4A is a cross-sectional side view of an embodiment of a gate-sinking pHEMT of the present invention. The main structure of the embodiment of FIG. 4A is basically the same as the structure of the embodiment of FIG. 3A, except that a first contact layer 65 is included. The first contact layer 65 is formed on the second stacked region 44 of the Schottky layer 40. An uppermost contact interface 55 is provided between the first contact layer 65 and the topmost stacked region of the Schottky layer. The first cap layer 67 is formed on the first contact layer 65, and the first gate metal layer 71 of the gate electrode 70 is deposited on the first contact layer 65 within the gate recess 82. The material of the first contact layer 65 is different from the material of the second stacked region 44. In current embodiment, the recess bottom 83 of the gate recess 82 is defined by the first contact layer 65, wherein the first gate metal layer 71 of the gate electrode 70 is in contact with the first contact layer 65. In some embodiments, the first contact layer 65 includes at least one of GaAs, AlGaAs, AlGaAsP, InAlGaAs, InGaP, InGaAsP, and InAlGaP.

In some embodiments, a gate-sinking lower limit 41 is located within the second stacked region 44, and a gate-sinking upper limit 43 is located within the first contact layer 65. In a preferable embodiment, the distance between the gate-sinking lower limit 41 and the uppermost contact interface 55 is less than or equal to 10 Å, and the distance between the gate-sinking upper limit 43 and the uppermost contact interface 55 is less than or equal to 10 Å. A bottom boundary 74 of the gate-sinking region 73 is located between the gate-sinking lower limit 41 and the gate-sinking upper limit 43.

Figure 4B:
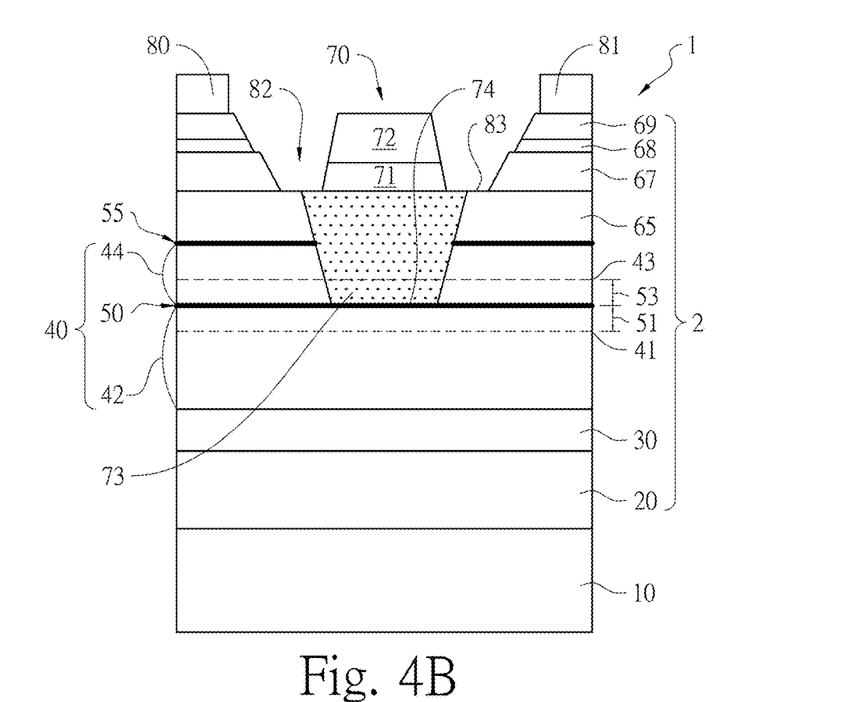

FIG. 4B is a cross-sectional side view of another embodiment of a gate-sinking pHEMT of the present invention. The main structure of the embodiment of FIG. 4B is basically the same as the structure of the embodiment of FIG. 4A, except that the epitaxial structure 2 further comprises an etch stop layer 68 and a second cap layer 69, wherein the etch stop layer 68 is formed on the first cap layer 67, the second cap layer 69 is formed on the etch stop layer 68, and the source electrode 80 and the drain electrode 81 are formed on the second cap layer 69. In some embodiments, the etch stop layer 68 may include at least one of InGaP, InGaAsP, InAlGaP, and AlAs. The second cap layer 69 may include GaAs.

Figure 5:
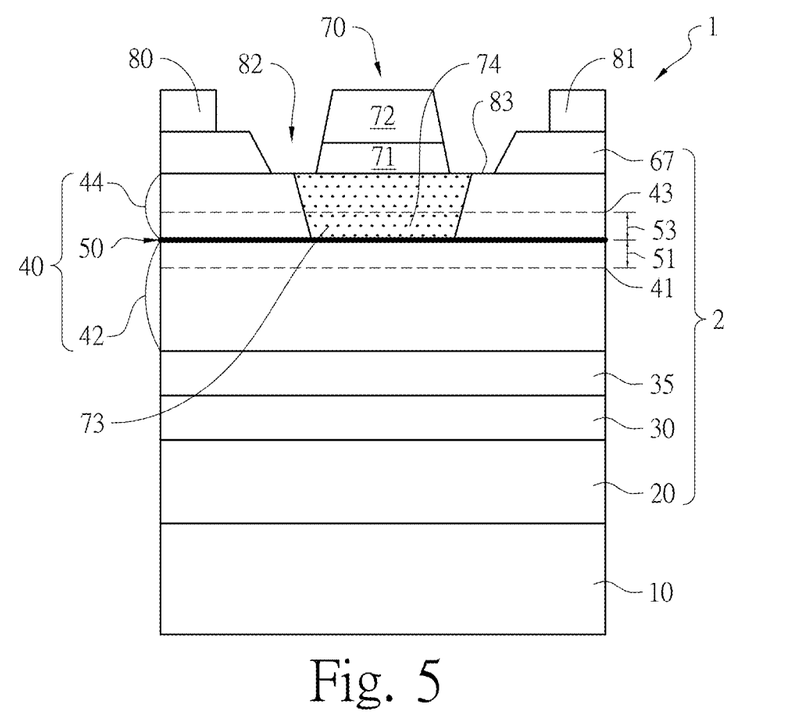
FIG. 5 is a simplified cross-sectional side view of embodiment of a gate-sinking pHEMT in accordance with the present invention.

FIG. 5 is a cross-sectional side view of an embodiment of a gate-sinking pHEMT of the present invention. The main structure of the embodiment of FIG. 5 is basically the same as the structure of the embodiment of FIG. 3A, except that the epitaxial structure 2 further comprises a carrier supply layer 35, wherein the carrier supply layer 35 is formed on the channel layer 30, and the first stacked region 42 is formed on the carrier supply layer 35. In some embodiments, the carrier supply layer 35 may include at least one of AlGaAs, AlGaAsP, and InAlGaAs.

Accordingly, the design of the structure of the gate-sinking pHEMT provided by the present invention can more precisely control the gate-to-channel distance of the device. The uniformity of the pinch-off voltage of the pHEMT across a wafer is improved. The device performance and quality are significantly enhanced, and therefore the economic benefit can be improved.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A gate-sinking pHEMT, comprising:
    a compound semiconductor substrate;
    an epitaxial structure formed on the compound semiconductor substrate, wherein the epitaxial structure comprises:
        a buffer layer formed on the compound semiconductor substrate;
        a channel layer formed on the buffer layer;
        a Schottky layer formed on the channel layer, wherein the Schottky layer comprises a first semiconductor stacked region and a second semiconductor stacked region formed on the first semiconductor stacked region, wherein the first semiconductor stacked region and the second semiconductor stacked region differ in material from each other and provide a stacked region contact interface therebetween, and wherein the first semiconductor stacked region is composed of AlGaAs-based semiconductor material and the second semiconductor stacked region is composed of InGaP-based semiconductor material; and
        a first cap layer formed on the Schottky layer;
    a source electrode formed on one end of the first cap layer;
    a drain electrode formed on the other end of the first cap layer, wherein a gate recess is located between the source electrode and the drain electrode; and
    a gate electrode, wherein the gate electrode comprises a first gate metal layer, wherein the first gate metal layer of the gate electrode is formed on the Schottky layer within the gate recess, wherein a gate-sinking region is beneath the gate electrode,
    wherein the AlGaAs-based semiconductor material is one of AlGaAsP and InAlGaAs, the InGaP-based semiconductor material is InGaP, a bottom boundary of the gate-sinking region is located in the AlGaAs-based semiconductor material of the first semiconductor stacked region, and the bottom boundary of the gate-sinking region is vertically spaced apart from the stacked region contact interface and is within 10 Å below the stacked region contact interface, or
    wherein the AlGaAs-based semiconductor material is AlGaAs, the InGaP-based semiconductor material is one of InGaPAs and AlInGaP, a bottom boundary of the gate-sinking region is located in the InGaP-based semiconductor material of the second semiconductor stacked region, and the bottom boundary of the gate-sinking region is vertically spaced apart from the stacked region contact interface and is within 10 Å above the stacked region contact interface.

2. The gate-sinking pHEMT according to claim 1, wherein a recess bottom of the gate recess is defined by a topmost stacked region of the Schottky layer, and wherein the first gate metal layer of the gate electrode is in contact with the topmost stacked region of the Schottky layer.

3. The gate-sinking pHEMT according to claim 2, wherein the epitaxial structure further comprises a first contact layer, wherein the first contact layer is in contact with an upper surface of a topmost stacked region of the Schottky layer, wherein the first cap layer is formed on the first contact layer, wherein the first contact layer includes at least one of GaAs, AlGaAs, AlGaAsP, InAlGaAs, InGaP, InGaAsP, and InAlGaP, wherein the first contact layer differs in material from the topmost stacked region of the Schottky layer.

4. The gate-sinking pHEMT according to claim 3, wherein a recess bottom of the gate recess is defined by the first contact layer, wherein the first gate metal layer of the gate electrode is in contact with the first contact layer.

5. The gate-sinking pHEMT according to claim 1, wherein the first gate metal layer of the gate electrode includes at least one of molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), and rhenium (Re).

6. The gate-sinking pHEMT according to claim 1, wherein the epitaxial structure further comprises an etch stop layer and a second cap layer, wherein the etch stop layer is formed on the first cap layer, wherein the second cap layer is formed on the etch stop layer, wherein the source electrode and the drain electrode is formed on the second cap layer.

7. The gate-sinking pHEMT according to claim 6, wherein the etch stop layer includes at least one of InGaP, InGaAsP, InAlGaP, and AlAs.

8. The gate-sinking pHEMT according to claim 6, wherein the second cap layer includes GaAs.

9. The gate-sinking pHEMT according to claim 1, wherein the first cap layer includes GaAs.

10. The gate-sinking pHEMT according to claim 1, wherein the channel layer includes at least one of GaAs and InGaAs.

11. The gate-sinking pHEMT according to claim 1, wherein the buffer layer includes at least one of GaAs and AlGaAs.

12. The gate-sinking pHEMT according to claim 1, wherein the compound semiconductor substrate includes GaAs.

13. The gate-sinking pHEMT according to claim 1, wherein the epitaxial structure further comprises a carrier supply layer, wherein the carrier supply layer is formed on the channel layer, wherein the Schottky layer is formed on the carrier supply layer.

14. The gate-sinking pHEMT according to claim 13, wherein the carrier supply layer includes at least one of AlGaAs, AlGaAsP, and InAlGaAs.

15. A gate-sinking pHEMT, comprising:
a compound semiconductor substrate;
a buffer layer on the compound semiconductor substrate;
a channel layer on the buffer layer;
a Schottky layer on the channel layer, wherein the Schottky layer comprises a first sub-layer of a first semiconductor material and a second sub-layer of a second semiconductor material that is different from the first semiconductor material, wherein the second sub-layer is on the first sub-layer, and the first sub-layer and the second sub-layer have a contact interface therebetween, and wherein the first semiconductor material is an AlGaAs-based semiconductor material, and the second semiconductor material is an InGaP-based semiconductor material;
a first cap layer on the Schottky layer;
a source electrode on one end of the first cap layer;
a drain electrode on the other end of the first cap layer; and
a gate electrode between the source electrode and the drain electrode, wherein a gate-sinking region is beneath the gate electrode,
wherein the AlGaAs-based semiconductor material is one of AlGaAsP and InAlGaAs, the InGaP-based semiconductor material is InGaP, a bottom boundary of the gate-sinking region is located in the AlGaAs-based semiconductor material of the first sub-layer, and the bottom boundary of the gate-sinking region is vertically spaced apart from the contact interface and is within 10 Å below the contact interface, or
wherein the AlGaAs-based semiconductor material is AlGaAs, the InGaP-based semiconductor material is one of InGaPAs and AlInGaP, a bottom boundary of the gate-sinking region is located in the InGaP-based semiconductor material of the second sub-layer, and the bottom boundary of the gate-sinking region is vertically spaced apart from the contact interface and is within 10 Å above the contact interface.

16. The gate-sinking pHEMT according to claim 15, wherein the gate electrode comprises molybdenum (Mo), tungsten (W), tungsten-silicide (WSi), titanium (Ti), iridium (Ir), palladium (Pd), platinum (Pt), nickel (Ni), cobalt (Co), chromium (Cr), ruthenium (Ru), osmium (Os), rhodium (Rh), tantalum (Ta), tantalum nitride (TaN), aluminum (Al), rhenium (Re), or a combination thereof.

17. The gate-sinking pHEMT according to claim 15, wherein a gate recess is located between the source electrode and the drain electrode, the gate electrode is formed within the gate recess, the gate-sinking region tapers toward the compound semiconductor substrate, and a width of a top boundary of the gate-sinking region is less than a width of a bottom boundary of the gate recess.

18. The gate-sinking pHEMT according to claim 1, wherein the gate-sinking region tapers toward the compound semiconductor substrate, and a width of a top boundary of the gate-sinking region is less than a width of a bottom boundary of the gate recess.

* * * * *